(12) United States Patent
O'Malley et al.

(10) Patent No.: US 9,093,986 B2
(45) Date of Patent: Jul. 28, 2015

(54) PULSE WIDTH MODULATION SYNCHRONIZATION OF SWITCHED MODE POWER CONVERTERS

(75) Inventors: Eamon O'Malley, Claremorris (IE); Paul Kelleher, Aherla (IE); Karl Rinne, Youghal (IE); Basil Almukhtar, Dooradoyle (IE)

(73) Assignee: Powervation Limited, Cork (IE)

( * ) Notice: Subject to any disclaimer, the term of this patent is extended or adjusted under 35 U.S.C. 154(b) by 1052 days.

(21) Appl. No.: 13/080,173

(22) Filed: Apr. 5, 2011

(65) Prior Publication Data
US 2011/0280299 A1 Nov. 17, 2011

(51) Int. Cl.
*H03L 7/085* (2006.01)
*H03K 7/00* (2006.01)
*H03K 5/156* (2006.01)
*H03L 7/07* (2006.01)
*H03K 7/08* (2006.01)
*H02J 1/10* (2006.01)
*H02M 3/158* (2006.01)

(52) U.S. Cl.
CPC .............. *H03K 7/00* (2013.01); *H03K 5/1565* (2013.01); *H03K 7/08* (2013.01); *H03L 7/07* (2013.01); *H02J 1/102* (2013.01); *H02M 3/1584* (2013.01)

(58) Field of Classification Search
CPC .......... H03L 7/07; H03K 7/08; H03K 5/1565; H02J 1/102; H02M 3/1584
USPC ................ 331/16, 34, 1 A, 47; 327/141, 175; 363/72
See application file for complete search history.

(56) References Cited

U.S. PATENT DOCUMENTS

| 5,495,209 | A | 2/1996 | Gerstenberg |
| 5,506,875 | A * | 4/1996 | Nuckolls et al. .............. 375/375 |
| 6,522,209 | B2 * | 2/2003 | Hughes .......................... 331/47 |
| 7,023,284 | B2 * | 4/2006 | Sogawa et al. ................. 331/10 |
| 7,368,959 | B1 | 5/2008 | Xu et al. |
| 2002/0171495 | A1 | 11/2002 | Hughes |
| 2004/0075600 | A1 | 4/2004 | Vera et al. |
| 2004/0232964 | A1 | 11/2004 | Wiktor et al. |
| 2005/0242858 | A1 | 11/2005 | Figoli et al. |
| 2006/0125451 | A1 | 6/2006 | Tabaian et al. |
| 2008/0042634 | A1 | 2/2008 | Harrison et al. |
| 2008/0162963 | A1 | 7/2008 | Kung et al. |
| 2008/0265680 | A1 | 10/2008 | Marwali et al. |

FOREIGN PATENT DOCUMENTS

| EP | 1394972 | 3/2004 |
| WO | 2004/082112 | 9/2004 |
| WO | 2010/136225 | 12/2010 |

OTHER PUBLICATIONS

International Preliminary Report on Patentability, PCT/EP/051326, report issued Nov. 29, 2011, 8 pages.
Combined Search and Examination Report; GB0909199.2, mailed Sep. 9, 2009, 6 pages.
International Search Report, PCT/EP2010/051326, mailed Oct. 21, 2010, 3 pages.

* cited by examiner

*Primary Examiner* — Arnold Kinkead
(74) *Attorney, Agent, or Firm* — GTC Law Group LLP & Affiliates

(57) ABSTRACT

The present disclosure is directed generally to switch mode power supplies operating in a master-slave configuration and provides a method of synchronizing the PWM outputs from the master and slave devices to avoid problems such, for example, as the generation of beat frequencies.

40 Claims, 11 Drawing Sheets

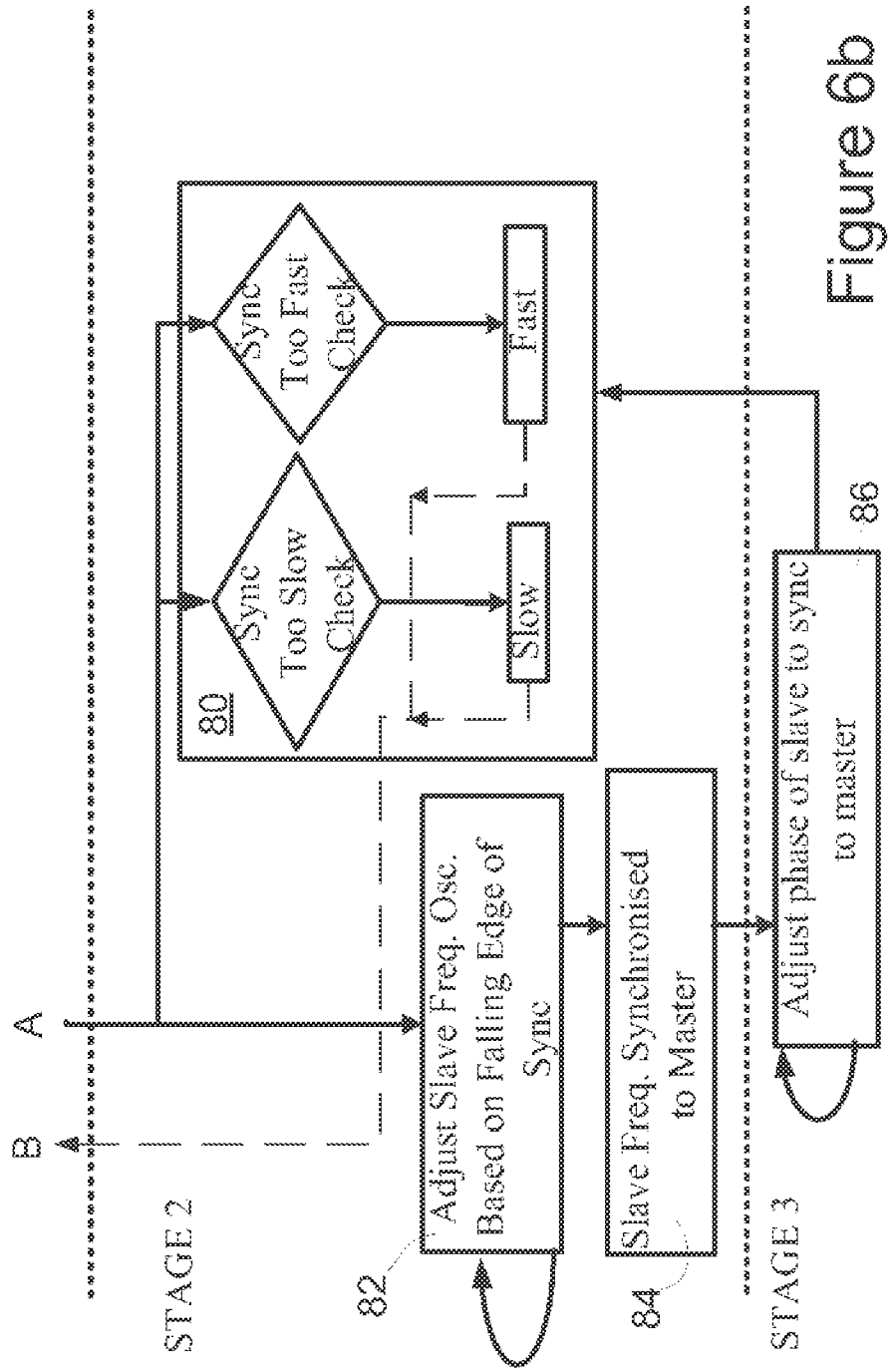

PULSE WIDTH MODULATION SYNCHRONIZATION OF SWITCHED MODE POWER CONVERTERS

FIELD

The present disclosure relates to switch mode power supplies and methods of synchronizing same.

BACKGROUND

There is a general demand for lower voltage, increased efficiency, high resolution and faster responses from power supplies. A generally recognized solution to this problem is the provision of multiple power supply devices on a single circuit board or more generally across multiple locations, for example, within a single computing device such as a server.

It is generally recognized that it is advantageous to have these multiple power supplies synchronized together to avoid problems such as beat frequencies and large output current ripple. To achieve synchronization between devices a number of different techniques have been developed.

These developed techniques include the approach of driving all the of the power supplies with a common clock. A problem with this approach is that it necessitates the provision of a relatively high speed clock signal possibly over a significant distance on a circuit which may be subject to noise and interference and/or indeed may generate same for other devices on the circuit board.

Another approach is to reduce the clock frequency of the master by a particular integer divisor to generate a sync signal and to multiply the sync signal by a corresponding integer multiple upon arrival at the slave side. A disadvantage of this approach is that in the event that there is no sync signal, e.g. where the master device malfunctions, then the slave circuit will not function. Another disadvantage is that an additional signal is required to phase align the master and slave PWM signals.

To solve this problem, it is known to employ a clock circuit within slave devices and to switch between the clock of the slave device and the clock signal generated from the master. This switch between the slave clock and the clock signal generated from the master may occur in response to the detection of the presence of the sync signal. The difficulty with this approach is that the transition between the two modes of operation is unpredictable and glitches such as the generation of multiple switching pulses in a given switching cycle from the slave PWM circuit may occur at the time of switchover. Another difficulty that can arise in these configurations is that if the sync signal from the master is lost or strays outside its normal operating range the slave circuit may fail to function either for a brief period or until the power is reset.

SUMMARY

The present application provides an alternative arrangement in which the master circuit provides a synchronization signal indicating a reference point in the PWM cycle of the master circuit to the slave device. The slave device in turn adjusts its internal clock frequency in response to the synchronization signal in an effort to match the duration of the PWM cycle of the slave to the duration of the PWM cycle of the master.

Once the durations of the PWM cycles are matched, the phase of the PWM circuit of the slave device may be set with respect to the PWM circuit of the master device.

The present application allows for frequency and phase lock between the master and slave devices using a single sync signal from the master to the slave. An embodiment of the patent describes a method to synchronize a slave to master in a single or multi phase digital PWM control configuration using a single ended signal in a 3 stage process. Synchronization of multiple PWM phase controller IC devices can deliver flexibility, performance and ease of use across a broad range of distributed power designs.

One embodiment is a method of synchronizing a PWM device to a synchronization (sync) signal, the PWM device generating a primary PWM output signal from a clock circuit. The method includes steps of determining when a frequency of the primary PWM output of the PWM device is within a predetermined error margin of a frequency of the sync signal. The method also includes, upon making such a determination, adjusting a clock circuit of the PWM device to force the frequency of the primary PWM output of the PWM device to match the frequency of the sync signal, and upon reaching this condition, the method includes a step of aligning a phase of the primary PWM output of the PWM device with respect to a phase of the sync signal.

Another embodiment is a method of operating at least two power supplies in a master-slave configuration. The method includes steps of a) generating at least one master PWM control signal from a master local clock, b) providing a sync signal derived from said at least one master PWM control signal to a slave, and also a step of c) generating at least one PWM control signal from a slave clock. The method also includes steps of d) determining whether a clock frequency of the PWM control signal of the slave is within a predefined range of the sync signal provided by the master, e) upon making such a determination, adjusting a clock frequency of the slave PWM control signal to cause the clock frequency of the slave PWM control signal to match a frequency of the sync signal, and f) phase aligning the matched slave PWM control signal to the sync signal.

Another embodiment is a PWM controller for generating at least one PWM control signal. The PWM controller includes a clock circuit for generating a clock signal, wherein the controller is configured to derive at least one PWM control signal from a clock input. The PWM controller also includes a sync module having a sync input for receiving a sync signal to which said at least one PWM control signal is to be synchronized. The sync module also includes a frequency comparator for detecting a condition when a frequency of the sync signal is within a predetermined range of the at least one PWM control signal, the sync module responsive to adjust the clock circuit to cause a frequency of at least one PWM control signal to match the frequency of the sync signal, the sync module being adapted upon matching the frequency of at least one PWM control signal to the frequency of the sync signal to align a phase of the PWM control signal relative to the sync signal. It is understood that there are many embodiments and that these examples are intended to be illustrative rather than limiting.

BRIEF DESCRIPTION OF THE DRAWINGS

FIGS. 6a and 6b represent an exemplary state diagram for implementing the present application, with FIG. 6a representing a first stage of coarse synchronization, with FIG. 6b a second stage of fine synchronization and synchronized third stage where the slave is locked and synchronized to the master.

DETAILED DESCRIPTION

The present application is directed to Pulse Width Modulated (PWM) power supplies and more particularly to a method of synchronization where one or more slave devices is controlled by a single master device using phase alignment of the PWM patterns. The PWM synchronization technique allows the timing of the pulse width modulation to be aligned between the master and slave(s) at the same switching frequency rate. Once the master and slave devices are frequency and phase locked then the PWM synchronization prevents the devices from drifting from each other with respect to the start of the pulse width modulation.

Figure 1:
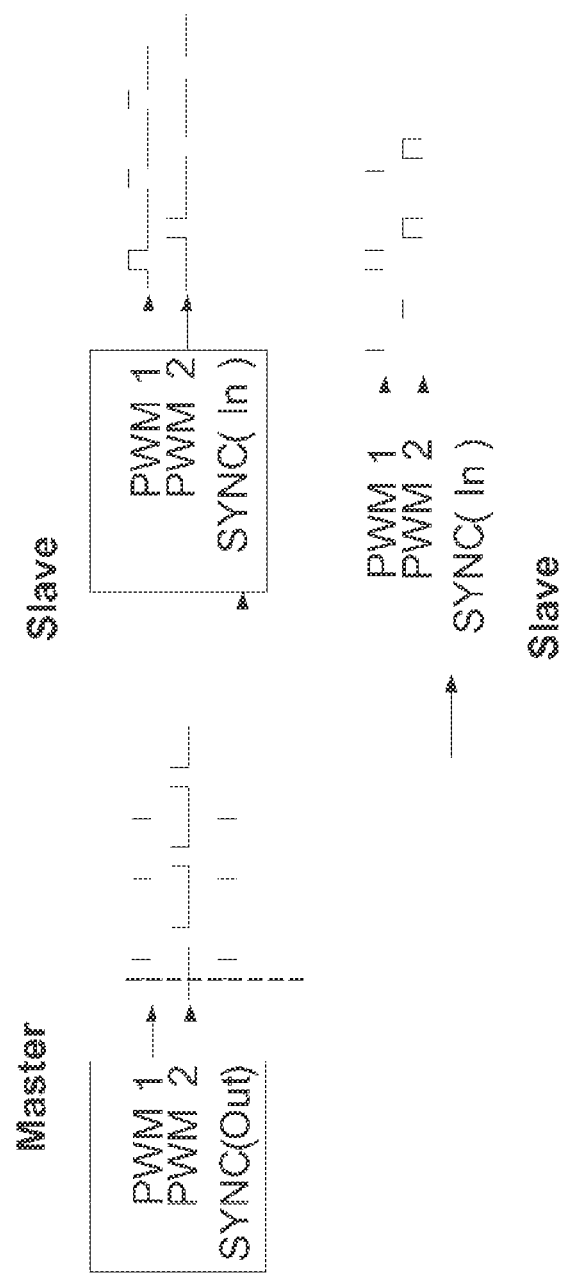
FIG. 1 is a block diagram of a circuit arrangement according to a first embodiment of the present application.

As may be seen in the exemplary embodiment of FIG. 1, a sync signal is provided as an output from a master PWM controller, and in turn as a sync input to two slave devices. It will be appreciated that there may be several slave devices or a single slave device. After synchronization lock, the PWM outputs from each of the slave devices are in sync with the master device. More specifically, the PWM synchronization is configured to ensure that the starting points of each slave PWM patterns are under the control of the designated master device and that the master and slave on-chip oscillators are frequency locked to within a certain error margin. It will be appreciated that whilst the slave PWM's may be in sync with the master PWM, the PWM outputs from the slave devices may be offset in phase by a programmable number of degrees, in fact in certain situations it may be advantageous that the individual PWM circuits whilst aligned are out of phase, for example to reduce voltage ripple (e.g. a master PWM two slave PWM devices are typically offset by 120 degrees from each other).

Another advantage is that once the PWM controllers are synchronized, their operating clock frequencies are substantially identical which provides for very accurate power up/down sequencing (ramp up/down) and turn on/off delays.

Desirably, each PWM device may be configured to be either a master or a slave. This configuration may be selected by means of a particular input or device setting. It will be appreciated that in this configurable situation, the SYNC pad/pin on the master device is programmed to be an output with a corresponding pad/pin on the slave device programmed as an input. It will be appreciated that in the context of the present application, the term pad is to be understood as meaning an electrical input/output from the device and may be taken to include a pin or other connection to other devices/circuits. It will further be appreciated that different pads may be provided for the sync in and sync out functions. An advantage of having a common pad on each device for the sync in/sync out function is that the user can reconfigure which device is the slave and which is the master without having to redesign the circuit. An appropriate logic level is selected for the sync signal, for example the SYNC signal may be single ended and active low. In the embodiment shown, the falling edge of the SYNC signal is aligned by the master device to the rising edge of a PWM output on the master device, in the example shown PWM1. The width of the active low SYNC pulse may be predefined or programmable.

An internal pull-up resistor in the SYNC pad may be employed to ensure the SYNC line is pulled high by default. In the event that two controller ICs are programmed incorrectly as masters there will not be a line conflict with both trying to drive the SYNC line low.

In turn, on the slave devices the SYNC pad is programmed to be an input. The slave device may be configured to operate in one of two modes of operation in terms of the PWM generation, namely:

free-running slave controlled PWM generation (by default)—where the PWM signals are generated autonomously of the master controller.

synchronized to the master (master-slave controlled)—PWM signals are generated with respect to the master controller on receiving a SYNC signal.

In order to switch from the first mode to the second mode of operation, where the slave PWM pattern generation is synchronised to the master PWM a 3 stage process has been adapted, including:

1. Detection of Valid Master Sync Pulses (aka Coarse Synchronization),

2. Frequency Lock Between the Master and Slave controllers (aka Fine Synchronization); and 3. PWM Lock between Master and Slave (aka Locked, synchronized and phase aligned).

Initially for the SYNC process the slave device is not under the control of the master device, i.e. the slave pwm_counter is basically free running following a local clock generated by a local clock circuit, comprising for example a local oscillator and Phase Locked Loop. In the first stage, the slave device examines the frequency of the sync signal to determine whether it is within a range to be considered coarsely synchronized to the sync signal from the master. To determine whether the slave is receiving valid sync pulses, i.e. coarse synchronization, the slave device suitably has two counters which are synchronized to the start of a PWM signal on the slave and which detects and counts the number N of input SYNC pulses received during the time it takes for the slave to generate M PWM pulses. If the value of N is within a certain error range, then coarse synchronization stage has been completed successfully. It will be appreciated that this coarse synchronization process is passive in the sense that coarse synchronization is a state determined by measurement rather than active adjustment of the signals. The purpose of coarse synchronization is to determine whether the incoming SYNC is within a frequency range such that the slave device can synchronize to it.

To assist in explaining the manner of operation of the coarse synchronization, some exemplary situations are demonstrated by the timing diagrams of FIGS. 2a-4b. In these figures, a number of timing signals are shown to help explain the operation of the method, it will be appreciated that some or all of these signals may be generated in a circuit and used, for example, for diagnostic and\or control purposes. In particular, the signals include a pwm start signal indicating when the slave device is switched on, whilst the PWM signal represents the primary PWM control signal generated by the slave device. The sync signal represents an incoming SYNC signal provided from a master device to the slave. The slow_master and fast_master represent whether the master sync signal is too slow or too fast for the slave as will be explained below. The sync_receiving_ok signal represents when the frequency of the master and the slave are sufficiently close to be considered coarsely synchronized. A first counter (output represented by sync_check_cnt) counts the PWM signal generated within the slave device, i.e. in the highlighted region of FIG. 2a, there has been hex C, i.e. 12 pulses from the slave devices PWM circuit, this count value represents the maximum value (M) of the counter. A second counter (sync_range_cnt) counts the number of pulses (N) arriving at the sync input during the time interval to reach count M on the first counter.

Figure 2A:
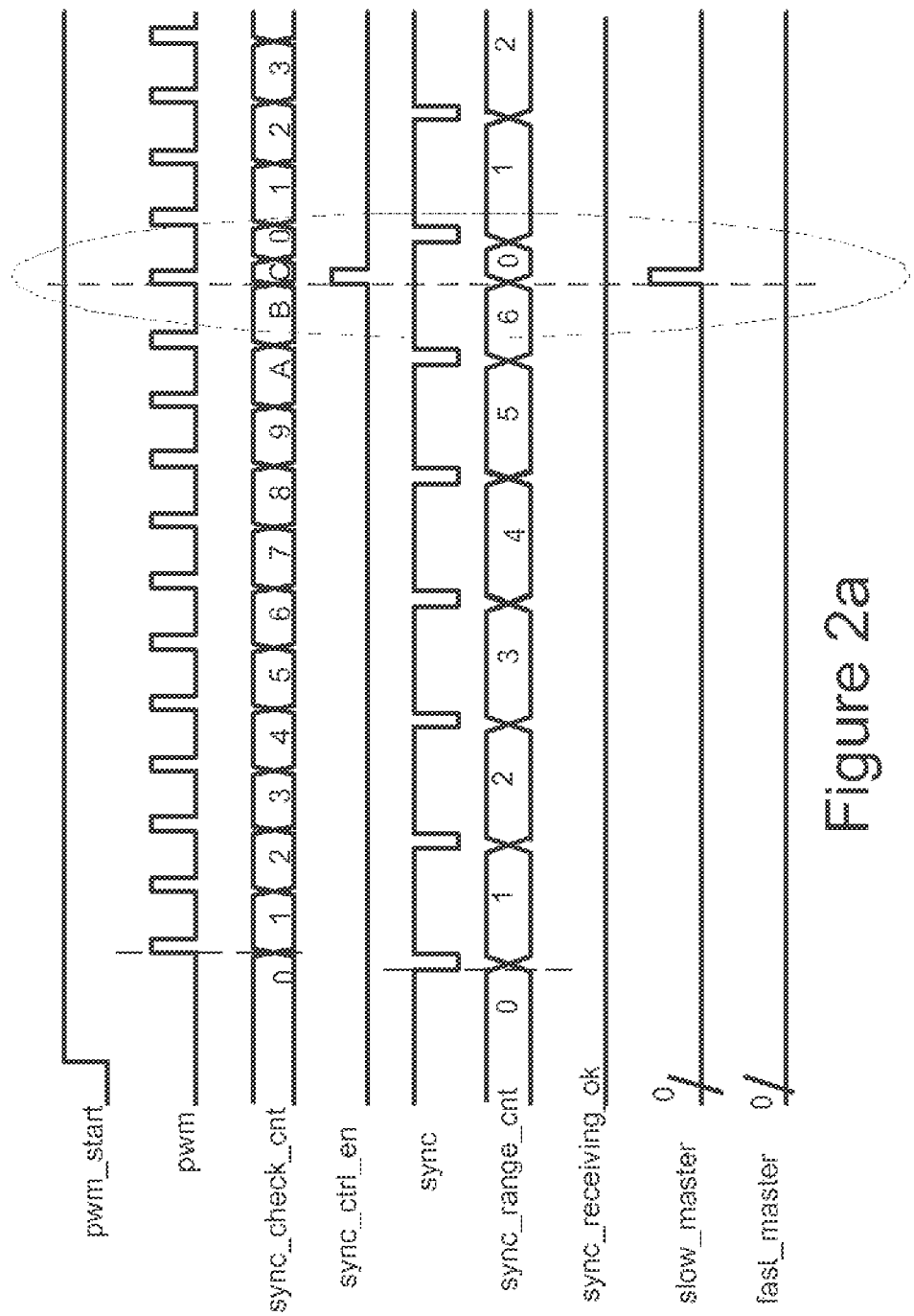
FIG. 2a is a slave timing diagram explaining the manner of operation of the present application where a sync pulse arrives too slow (late) to permit synchronization.

In the example shown in FIG. 2a, when the sync_check_cnt (M) reached hex C, the value on the second counter (output represented by sync_range_cnt) had only reached 6 indicating that the incoming sync signal was slower than the PWM signal (i.e. local slave clock operating faster than the master clock). The slow_master signal is shown as being triggered in response to this state. As the initial step is only one of coarse synchronization, it is not necessary that the two counter values be identical for synchronization in this stage to be achieved. Instead, a range value is employed. This range value may be fixed, or it may be programmable by the user. A suitable error margin or range setting for coarse synchronization when the first counter counts to 12 is ±2, i.e. the slave will be coarse synchronized when the sync_range count is within the range 10 to 14, after the sync check count has reached 12. It will be appreciated that the precise range will depend on the size of the counters selected and other design considerations. In turn, the selection of the error margin\range will depend on the size selected for the M value of sync_check_count. However, in order for the second stage of synchronization to be achieved, it will be appreciated from the description below that the predetermined error margin cannot be greater than the maximum adjustment available in the clock circuit of the PWM device as otherwise it would be impossible to achieve fine synchronization in some circumstances even where coarse synchronization had been achieved.

Figure 2B:
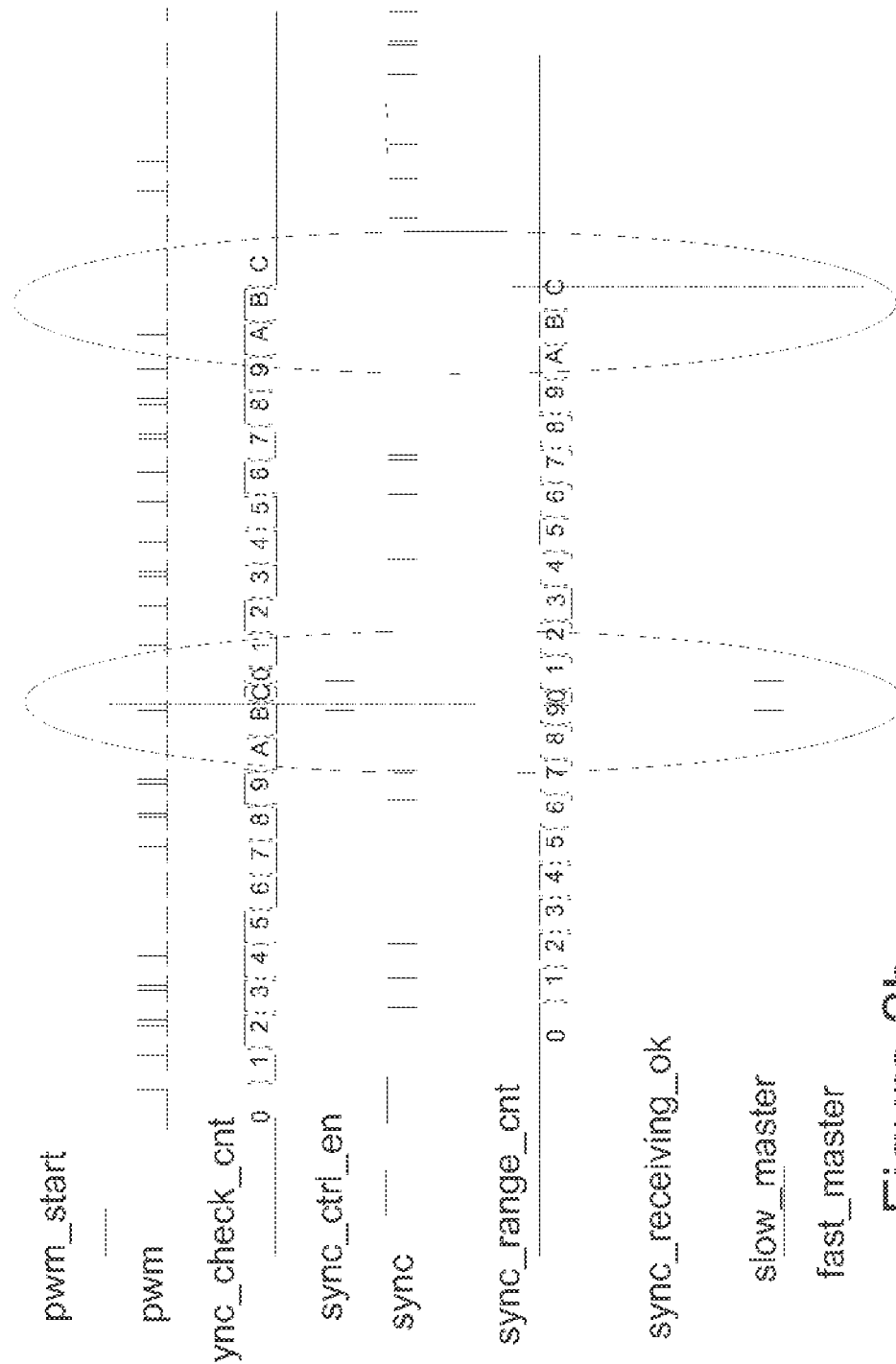
FIG. 2b is a further slave timing diagram explaining the manner of operation of the present application where a sync pulse arrives late initially but a subsequent sync pulse arrives on time.

In contrast, in FIG. 2b, whilst within the initial full count M, i.e. hex C, of the first counter (sync_check_cnt), the count N on the second counter (sync_range_cnt) only reaches 9 (the initial sync pulse starts too late) indicating that the master sync signal is too slow (as shown by the initial triggering of the slow_master signal). However, in the subsequent count shown, the second counter has reached the count of hex C, when the first counter reaches this value indicating that the master and slave are coarsely synchronized.

Figure 3:
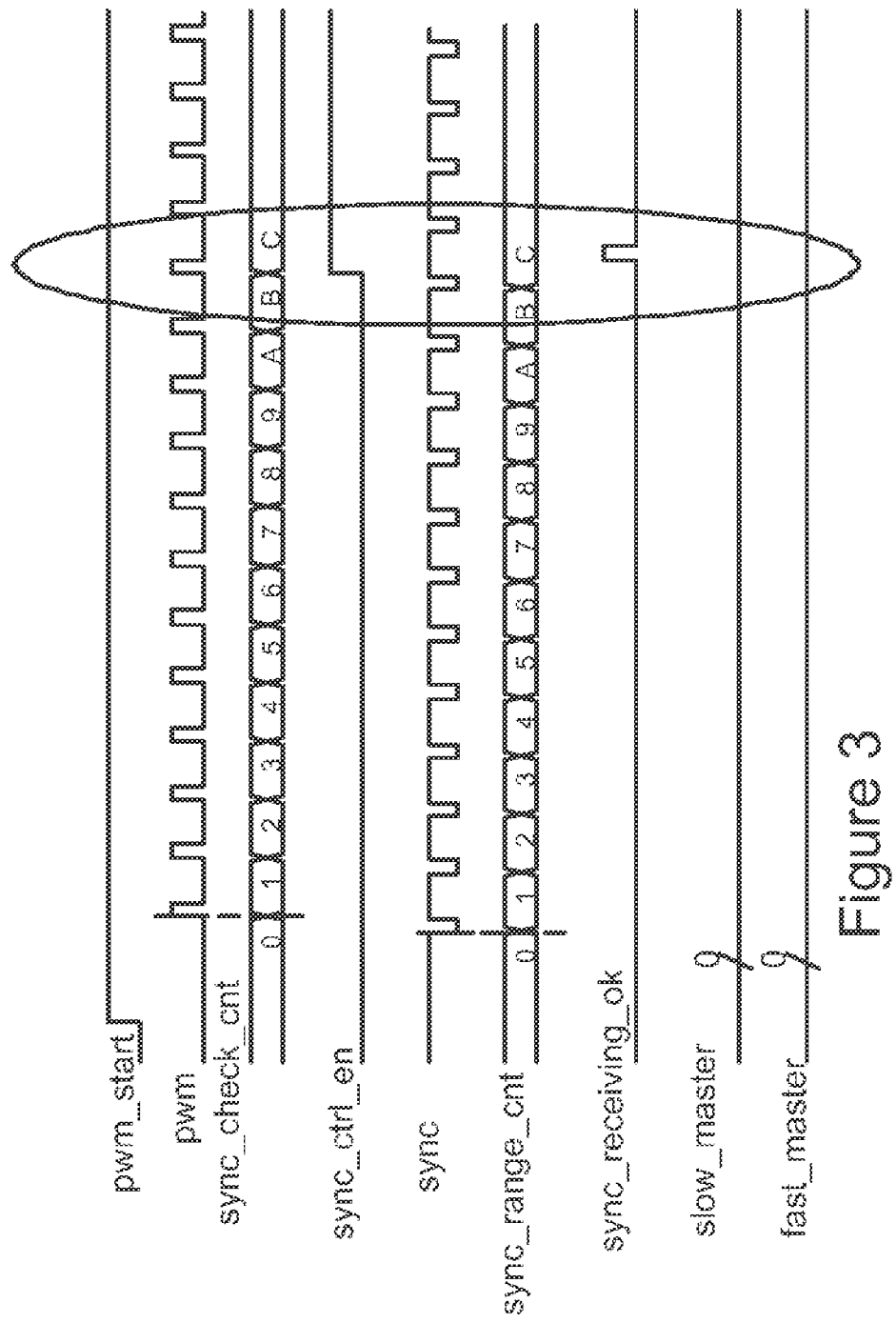
FIG. 3 is a further slave timing diagram explaining the manner of operation of the present application where a sync pulse arrives on time.
Figure 4A:
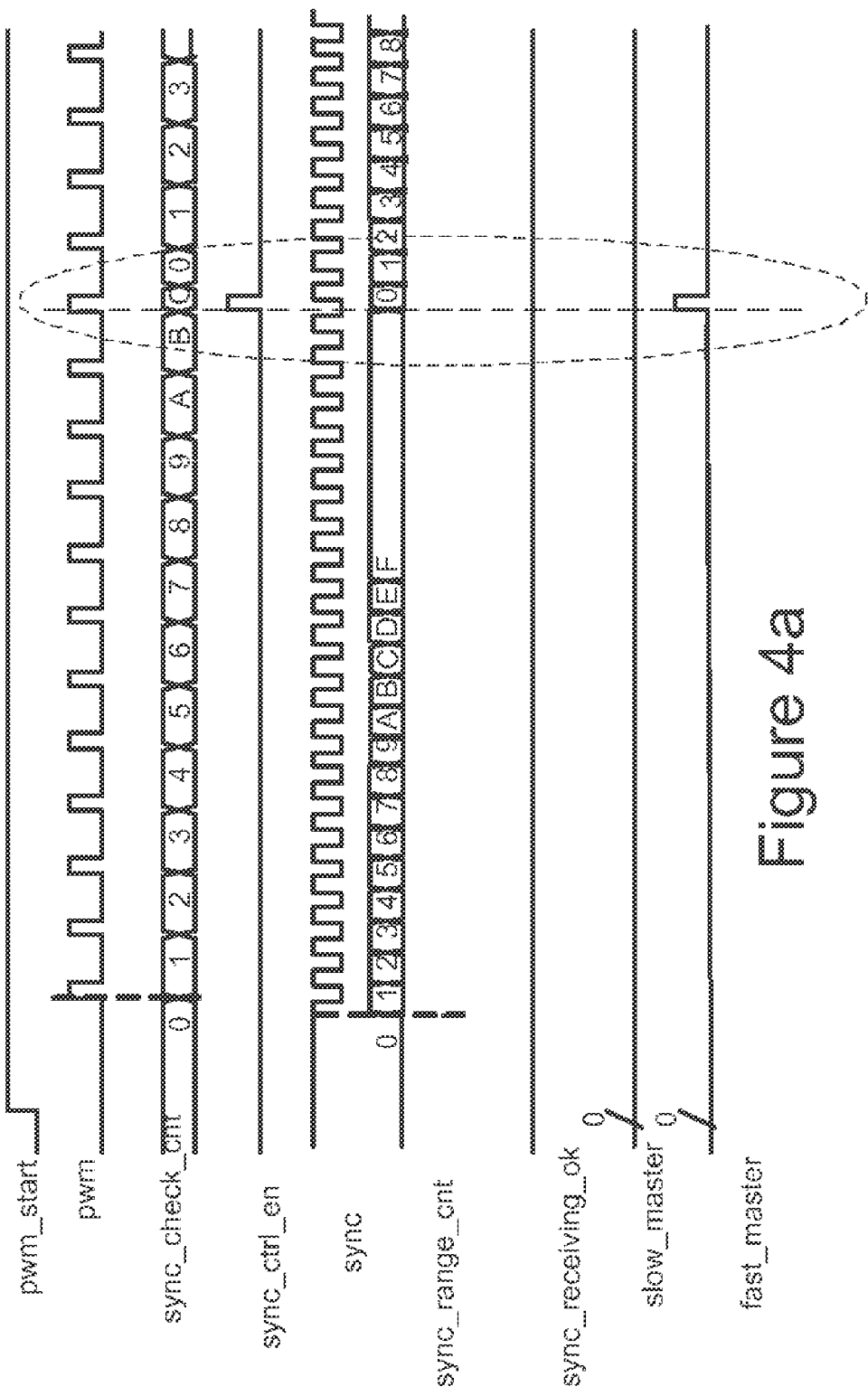
FIG. 4a is a further timing diagram explaining the manner of operation of the present application in a situation where a sync pulse arrives too fast (early).
Figure 4B:
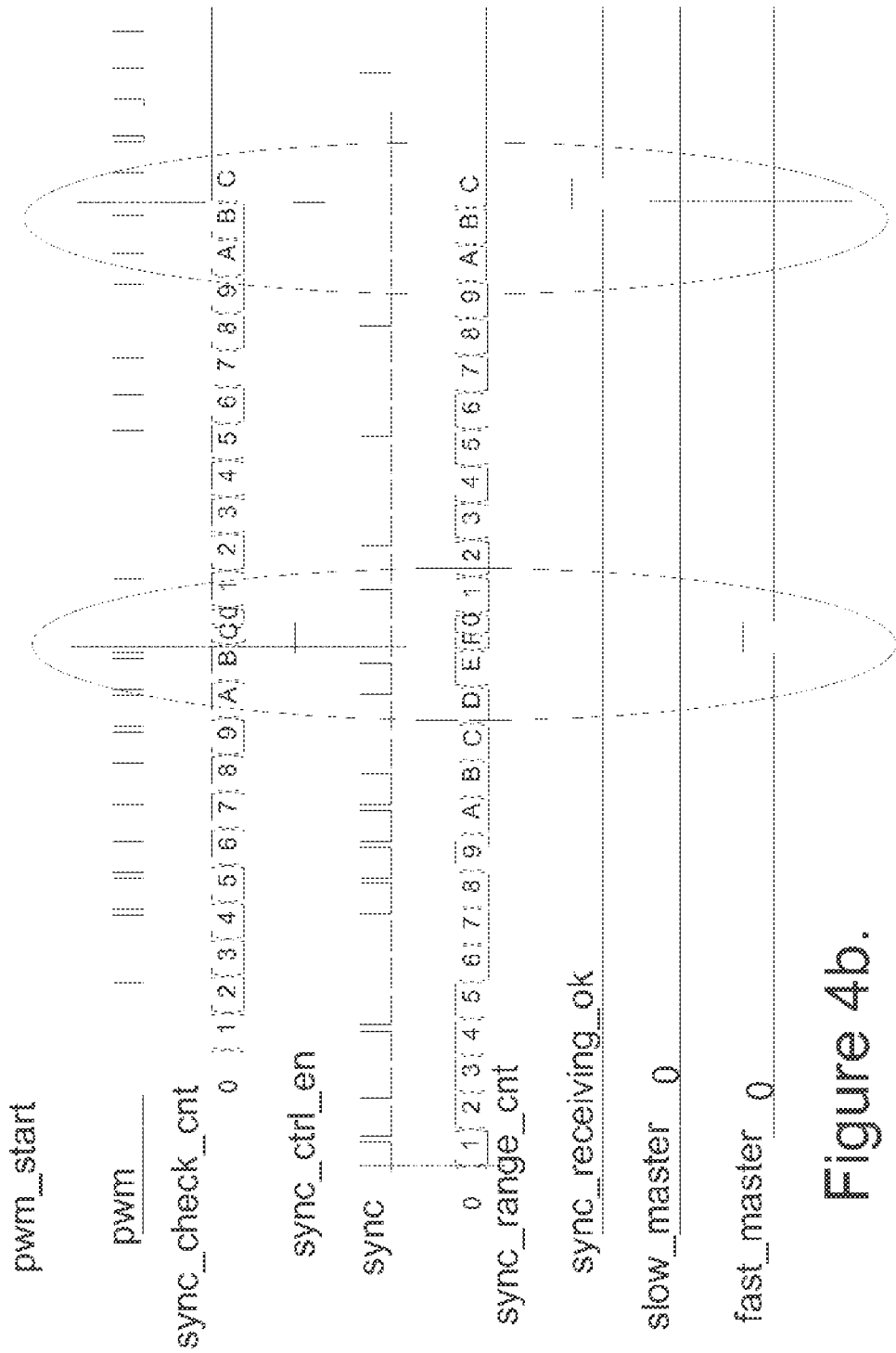
FIG. 4b is a further slave timing diagram explaining the manner of operation of the present application, in a situation where a sync pulse arrive too early initially, but a subsequent sync pulse arrives on time.

An example of a situation in which the slave and master are determined to be in synchronization from the start is shown in FIG. 3 as the count values are within the predetermined range, whereas in FIG. 4a, an example of where the master is too fast is shown since the sync_range_cnt has reached its maximum value (hex F) long before the sync_check_cnt counter has reached it's value of M (C in this example). FIG. 4b illustrates an example of where the master is initially too fast but then comes within range of the slave.

It will be appreciated that other techniques may be employed to determine whether the two devices are coarsely synchronized but the exemplary use of counters described above is reliable, inexpensive and relatively simple to implement in logic circuitry.

Once the slave is determined to be coarsely synchronized with the master, the second stage of synchronization process occurs. In the second stage, the frequency of the slave clock is locked to the clock frequency of the master, by adjusting the clock circuit so that the PWM control signal produced by the slave is the same frequency as the incoming sync signal from the master.

In the second stage of the SYNC process the slave device is not under the control of the master device. Instead, the slave device operates autonomously generating PWM signals while at the same time adjusting its oscillator frequency (internal clock circuit) using the position of the falling edge of the received SYNC pulse from the master to indicate any phase difference between the master and slave frequency PWM patterns. In response to the indicated phase differences, the slave adjusts (increases or decreases) the frequency of its PWM signal. This adjustment continues until the slave device is within a defined error margin (this error margin may be fixed and\or user programmable). Once 84 the slave device is frequency locked to the master and remains so for a period of time then the slave will switch from slave controlled PWM generation (free-running) control to master-slave controlled PWM generation (stage 3). It should be appreciated that at all times during this second stage process, the slave operates in response to its own internal clock.

In the third stage of the SYNC process the slave device is switched to be under the control of the master device. In this stage, the PWM patterns of the slave are phase synchronized 86 to the master by alignment of the PWM control signal of the slave to the incoming SYNC pulses from the master. In master-slave controlled PWM generation on the slave device the start of the PWM generation is determined by the location of the falling edge of the received SYNC pulse which is generated from the rising edge of the master device PWM signal. PWM synchronization has now been achieved between master and slave devices. It should be appreciated that whilst in synchronization, the slave device is operating at the same frequency as the master and its phase is aligned with that of the incoming sync signal, the slave device is still generating its own PWM control signals from its clock circuit. Thus if the sync signal disappears the slave will continue to function correctly without missing a pulse.

Accordingly, the slave and master will remain synchronized until an error condition occurs (e.g. master device goes faulty and SYNC pulses are no longer transmitted) at which stage the slave will exit synchronization and return to generating autonomous PWM signals without reference to the master SYNC signal. After the slave has exited synchronization it will attempt to re-synchronize again if programmed to do so.

The time period (phase delay) from the falling edge of SYNC pulse to the start of the slave PWM pattern generation may be programmable. This allows for different phase offsets to be programmed into different slave devices to minimize voltage ripple on switched voltage outputs from the master and slave devices.

Advantageously, the switch from the autonomous slave generation of PWM control signals to the master-slave generation is clean and does not generate any undesirable mode of operations (e.g. double pulses, shortened or extended pulse widths), which are problems identified with the prior art.

Figure 5:
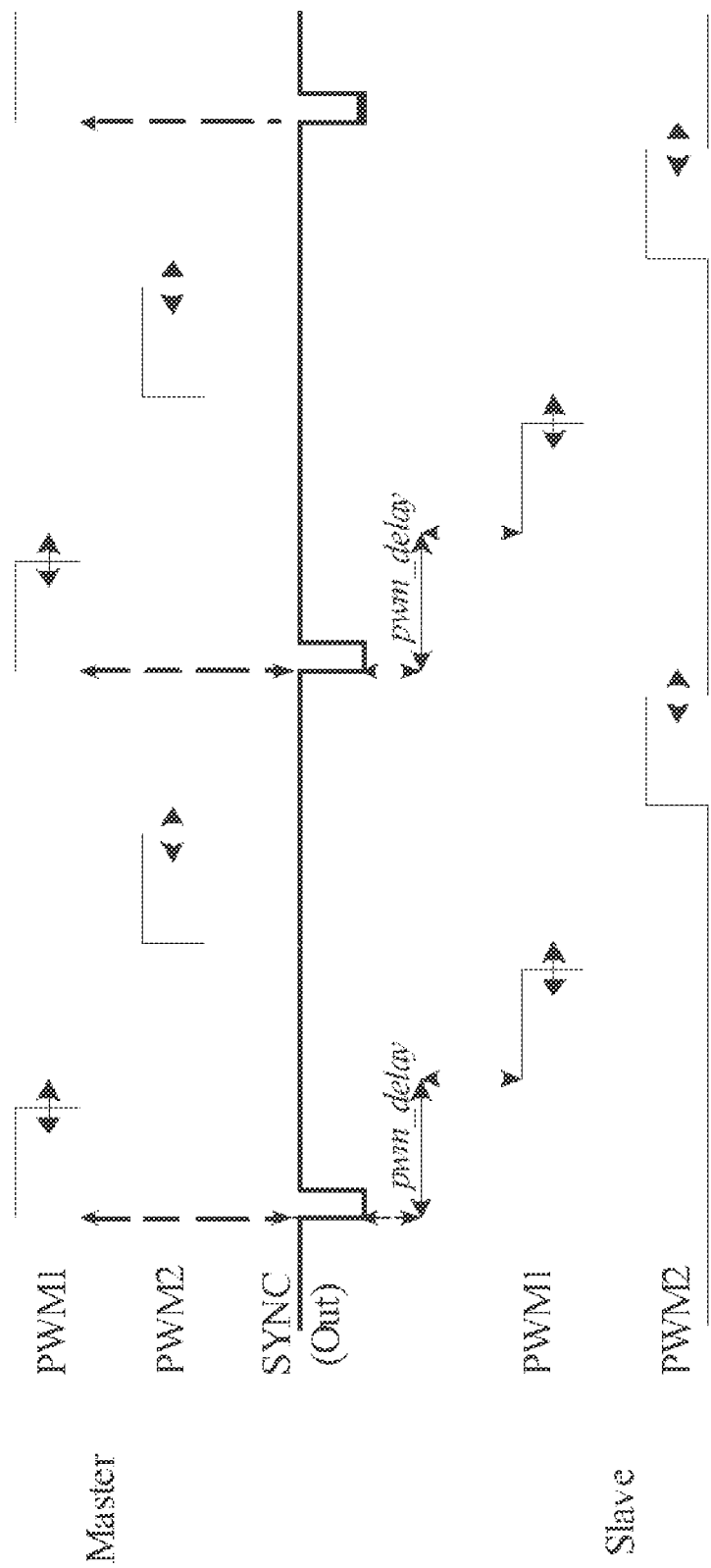
FIG. 5 is a further timing diagram explaining the manner of operation of the present application, in particular a master PWM and sync signals versus a slave PWM signals.

FIG. 5 illustrates an incoming SYNC signal generated by the master device which may be used to align the slave PWM patterns to the master PWM patterns. The slave PWM1 is set high on the detection of the falling edge of SYNC and after a programmable delay (which can be set to 0 if required) is reached and is reset based on an internal counter value which represents the width of the PWM pulse. Once locked the start position of the slave PWM pulse will follow the SYNC pulse movements either speeding up or slowing down based on the master PWM frequency.

Another advantage of the present application is that the previously identified error signals slow_master and fast_master may continue to be calculated/tested at stages 2 and 3. In the event that one or more of these errors arise, the slave can exit any stage and return to stage one. This is a significant advantage over the prior art, where such a change could result in a controller being locked out and requiring a hardware reset in such circumstances to bring the system back to normal operating mode. The present application also allows for the slave to re-try synchronization again if it exits master-slave synchronization or it can be prevented from re-trying until programmed to do so. This prevents the situation of entering and exiting master-slave synchronization on a continuous basis.

In summary the slave device oscillator (clock) is initially frequency locked to the master device using the open loop phase alignment of the PWM patterns via the SYNC pulse. The slave and master clocks are then frequency locked to within a certain error margin and finally the PWM counters on the master and slave are phase aligned via the SYNC pulse.

In all stages the slave device may check for slow and fast arriving SYNC pulses and flag the error condition if enabled. An error condition will result in the slave device resetting itself back to stage one. This will cause the exit from any stage resulting in the slave returning to free-running PWM pattern generations which are not aligned to the master until all three stages are completed again. The option is available to allow for only one entry into master-slave synchronization and lock out (programmable) if an error condition occurs.

Figure 6A:
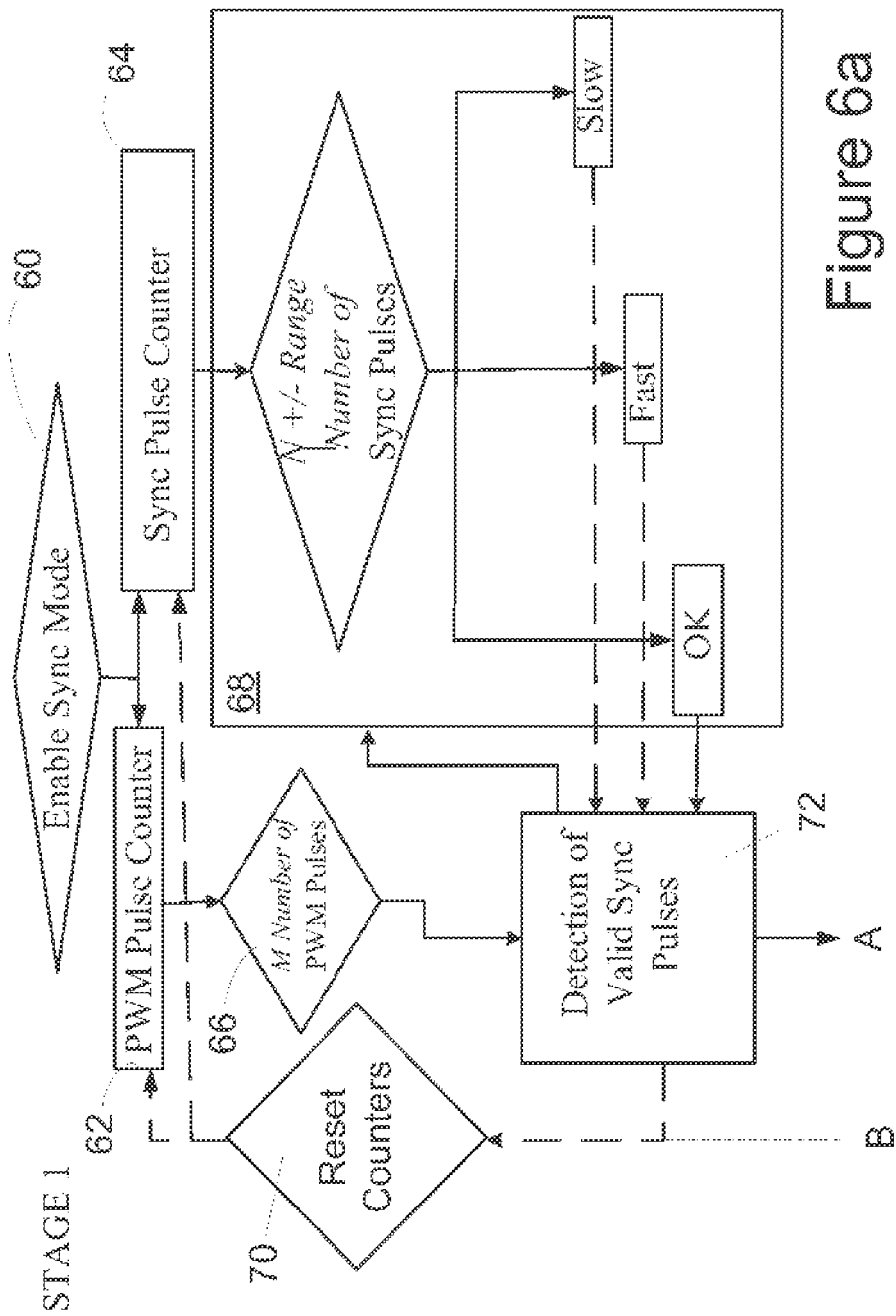

An exemplary mode of implementation is demonstrated by the state diagram of FIGS. 6a, which is explained below and represents the first stage (Coarse Synchronization) of the method when the slave is not synchronized and is entirely responsible for generating its own PWM pulses.

Suitably, the slave PWM device has a control register which may be used to determine its mode of operation. It will be appreciated that in alternative configurations a control register may not be employed and/or that certain control values may not be used or other control values may be employed. This control register may contain a value indicating whether the device is to be a slave or a master. Another control value may be employed to enable/disable the synchronization function on a device configured as a slave.

Once this setting is enabled 60, two counters are initialised and commence counting. The first counter 62 counts the number of pulses (PWM1 signal of FIG. 5) generated by the PWM circuit of the slave (sync_check_cnt), whilst the second counter 64 (sync_range_cnt) is incremented every time a SYNC input pulse is received from the master device.

When the first counter 62 (sync_check_cnt) reaches a point 66 where the count is 12 (OC hex) (as explained previously) the value of sync_range_cnt is checked 68 to identify how many SYNC pulses were received during the last 12 PWM1 switching cycles.

Greater than 10 and less than 14 (Range 12+/−2 error range) then the SYNC pulse is being generated correctly by the master and the slave is receiving ok (i.e. considered to be coarsely synchronised). A suitable condition is set to indicate this, e.g. a sync_ctrl_en signal is set high.

Less than 10 then the master is too slow and the slave is not permitted to synchronize to the master. An error condition is indicated and the counters reset and stage 1 starts all over again.

Greater than 14 then the master is too fast and the slave cannot synchronize. An error condition is indicated and the counters are reset and stage 1 starts all over again.

If no error conditions exist and the sync ctrl_en_signal remains high, then the system may proceed to stage 2 (FIG. 6A, arrow A) (Fine Synchronisation).

In stage 1, the slave device controls how the PWM patterns are generated (free-running) As would be familiar to those skilled in the art, a clock circuit may be employed to drive a pwm counter from which the PWM control signals are generated. In particular, an internal pwm counter pwm1_counter may be employed that wraps around to zero when it is incremented to its maximum value. At the maximum value of the counter, the PWM1 signal of the slave device is set high and the counter reset. A second PWM signal PWM2 is offset from the start of the PWM1 signal by a programmable value (e.g. 180 degree offset). It will be appreciated for the context of understanding the present application, that the precise use of the PWM control signals need not be explained merely that they are used in the control of switching elements within a supply circuit to generate a required output voltage using techniques such as for example boost, buck, flyback and other switching topologies.

During the second stage (Fine Synchronization) and third stage a series of checks may be continuously employed to ensure that the incoming SYNC pulse is not too slow or too fast which might cause the entire process returning to stage 1. This continuous checking (80, FIG. 6b) for errors may suitably be enabled/disabled as appropriate by the user by means of a programmable setting.

In the second stage, the relative position of the arrival of the SYNC pulse with respect to the internal pwm counter (pwm1_counter) is recorded and compared 82 with the relative position of the successive SYNC pulse. It will be appreciated that the difference between these two signals indicates whether the master is operating faster or slower than the slave.

Figure 7:
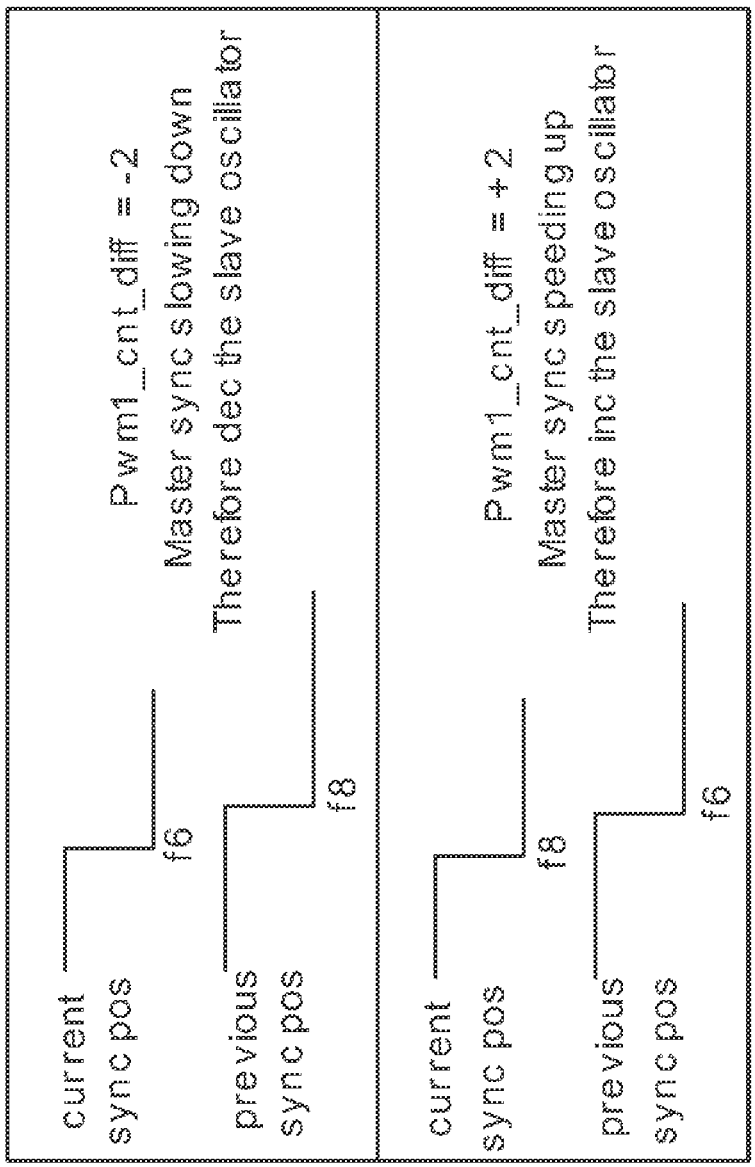
FIG. 7 is a timing diagram illustrating a change in sync position as an example of a particular aspect of the present application.

As illustrated in FIG. 7: If the difference is negative (initial count 8, subsequent count 6) then the SYNC pulse from the master device is slower and the slave device should be adjusted to follow. If the difference is positive (initial count 6, subsequent count 8) then the master device is faster and the slave device should be adjusted to follow. In contrast, to the first stage coarse synchronisation where the frequency comparison is performed over a predetermined number of generated PWM1 cycles, the frequency comparisons employed in the second stage are performed once each PWM1 cycle.

Figure 8:
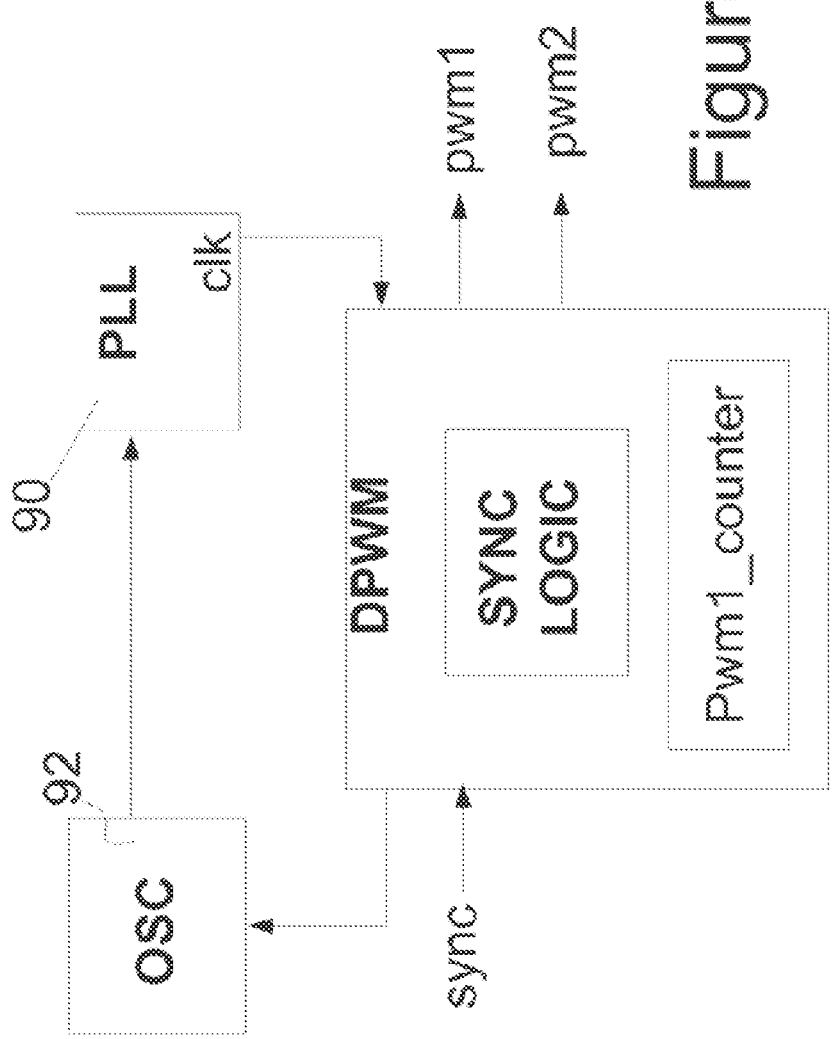
FIG. 8 is a block diagram of an exemplary implementation of closed loop controller generating a PWM signal from a local oscillator.

Suitably, the local clock circuit within the slave device incorporates functionality to allow it to increase or decrease its frequency. In an advantageous implementation, shown in FIG. 8, the local clock circuit comprises a Phase Locked Loop 90 or Delay Locked Loop which in turn is connected to a programmable oscillator 92. The output from the PLL may be used to provide a clock signal for driving the internal pwm counter and sync logic of the slave device.

Suitably, a trim register is employed within the oscillator to provide a trim value determining the output frequency of the oscillator 92 as would be familiar to those skilled in the art.

The value within this trim register may be adjusted based on the above described comparison of successive sync pulses. An error margin may be programmed or preset whereby only a difference in the relative positions of successive sync exceeding this error margin would result in the trim register being adjusted.

For stability reasons, the speed with which the trim register is adjusted may be limited. An effective and simple way to achieve this would be to employ a larger register than required for the trim value. For example, where the clock circuit employs 8 bit register for the trim value setting the output frequency, a larger (e.g. 12 bit) register may be employed within the sync logic with only the 8 MSB's being fed from the sync logic to the trim register of the oscillator.

The larger 12 bit register suitably has increment and decrement inputs which operate on the entire 12 bits. Thus where comparison of the relative positions of successive sync pulses has identified the sync pulse is faster, an increment signal may be applied to the increment input of the larger register and similarly where a comparison of the relative positions of successive sync pulses has identified the sync pulse is slower, an decrement signal may be applied to the decrement input of the larger register. It will be appreciated that since only the 8 MSB's of the 12 bit register are fed to the trim register, that the rate at which the trim register is adjusted will be slowed considerably as 16 increments or decrements will be required to achieve a change in the LSB of the trim register. This ensures stability of the phase locked loop.

The larger 12 bit register may also be employed to detect for error conditions, thus if the 12 bit register was decremented to all zeros (negative saturation reached) any further attempt to decrement it would indicate an error condition and the system may return to stage 1 (if the sync logic is programmed or preset to do so). Similarly, attempting to exceed positive saturation (all ones) could generate an error condition.

This process of incrementing or decrementing the oscillator value continues until the slave device is frequency locked to the master device within a certain tolerance. This locking may be indicated, for example, by a state when there are no increments or decrements over a predetermined period, for example 16 switching cycles (16 PWM1 switching cycles). In this state it is considered that the slave is finely synchronized to the master and it is safe to switch from slave-controlled (free-running) PWM pattern generation to the master-slave synchronised PWM pattern generation. In stage 2, the slave device controls when the PWM patterns are generated, as described previously, up to the point where switch over occurs (stage 3).

In the final stage (Stage 3), the phase of the slave is locked to that of the master so that the Master and Slave are effectively operating at the same frequency to within a certain tolerance. The process in stage 3 occurs as follows:

Once the slave and master are locked (i.e. completion of stage 2) then the pwm1_counter is reset every time an incoming SYNC pulse is detected. Thus, the PWM1 signal which is generated from this pwm1_counter will be set with respect to the SYNC pulse. A programmable delay may be included as shown in FIG. 5. The slave device may remain in synchronization until an error condition is detected.

Suitably, the synchronization process is a frequency closed loop system. The oscillator provides the clock reference to the PLL. The PLL generates the clock for the device including the DPWM module The oscillator frequency is modified via the trim register (previously described) value until the frequency of the slave device matches the frequency of the master device to within a certain range and tolerance. Once the switch over from the slave generation PWM patterns to master-slave PWM pattern generation occurs then synchronization is complete. After synchronization the slave oscillator tracks the master oscillator using the increment and decrement signals which modifies the larger register value accordingly. Monitoring of the difference between the current SYNC position and the previous SYNC position may continue to run after the switch over until an error condition occurs.

In one embodiment, if an error signal is detected by error detection 80 the system may return to the first stage with the value of the trim register immediately defaulting back to a factory or pre-programmed setting.

In an alternative embodiment the trim value may be reset back to the factory or pre-programmed setting gradually by reducing the value sent to the oscillator in gradual step sizes rather than a single jump back to the factory setting. The granularity of the step size may be programmable via a register.

The multi-stage synchronization process of the present application ensures correct and reliable synchronization of the PWM patterns between the master and slave(s) device(s) using a single ended SYNC signal. The method provides safe and flexible way to switch from the slave generating the PWM patterns (free-running) to the PWM patterns being aligned to the master device PWM patterns. It will be appreciated that whilst the slave PWM signal is synchronized to the incoming sync signal of the master, it is generated separately and accordingly if the sync signal is lost temporarily the slave device continues to function without losing a pulse or requiring a hardware reset to be put in place.

In a further embodiment, each of the PWM controllers may comprise at least one status register. The status register suitably contains values indicating a status of the synchronisation process in the PWM controller, for example whether the PWM controller is synchronized or not. The status register may also indicate the presence of one or more error states. The status registers may be accessible for reading by a host computer or on-chip microprocessor. This allows for further system debug/monitoring.

In the foregoing specification, the application has been described with reference to specific examples of embodiments. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections. Thus as an example, whilst the present application has been described with reference to a master-slave configuration where the master is a controller as well, it will be appreciated that this need not be the case and an external sync signal may be generated by another entity (e.g. an external clock signal) other than a master controller and the scheme will still work as long as that sync within the above described error margin of the frequency of the PWM signal being synchronised.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "falling", "rising" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other ways than those illustrated or otherwise described herein.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A method of synchronizing a PWM device to a synchronization (sync) signal, the PWM device generating a primary PWM output signal from a clock circuit, the method comprising:
    determining when a frequency of the primary PWM output of the PWM device is within a predetermined error margin of a frequency of the sync signal;
    upon making such a determination, adjusting a clock circuit of the PWM device to force the frequency of the primary PWM output of the PWM device to match the frequency of the sync signal, and
    upon reaching this condition, aligning a phase of the primary PWM output of the PWM device with respect to a phase of the sync signal such that there is a phase offset between the sync signal and the primary PWM output,
    wherein the step of determining when the frequency of the primary PWM output of the PWM device is within a predetermined frequency error margin of the sync signal comprises:
    counting a number of sync pulses received within a period defined by a predetermined count of primary PWM pulses of slave devices; and
    determining if the count of sync pulses is within a predetermined count margin of the predetermined count.

2. A method according to claim 1, wherein the predetermined error margin corresponds to a maximum adjustment available in the clock circuit of the PWM device.

3. A method according to claim 1, wherein the predetermined count of primary PWM pulses or the predetermined count margin, or both, are programmable.

4. A method according to claim 1, wherein a default predetermined count value is 12 and a default predefined count margin is ±2.

5. A method according claim 1, wherein a rate of adjustment of the frequency from the clock circuit is limited to maintain stability of the clock circuit.

6. A method according to claim 1, further comprising the step of monitoring the primary PWM signal and the sync signal for a difference in frequency between the primary PWM signal and the sync signal and exiting synchronization upon detection of such a difference.

7. A method according to claim 1, wherein the step of aligning the phase of the primary PWM output is performed during an inactive period in a switching cycle of the PWM output to ensure no PWM pulse is lost, cut short or extended during synchronization.

8. A method according to claim 1, wherein the phase offset is selected from the group consisting of 120 degrees and 180 degrees.

9. A method according to claim 8, wherein the phase offset is programmable.

10. A method according to claim 1, wherein the PWM device is a slave PWM device.

11. A method according to claim 1, wherein the PWM device is a slave PWM device and the sync signal is provided from a master PWM device, the master PWM device generating a primary PWM output signal from a clock circuit from which the sync signal is derived.

12. A method according to claim 10, wherein the sync signal is provided by a master PWM device.

13. A method according to claim 12, wherein the master PWM device generates a primary PWM output signal from a clock signal and in turn generates the sync signal from the primary PWM output signal of the master device.

14. A method according to claim 12, wherein the sync signal comprises a pulse which is triggered from an edge of the primary PWM of the master device.

15. A method according to claim 14, wherein the duration of the pulse is predetermined or wherein the duration of the pulse is programmable.

16. A method of synchronizing actions of at least one slave PWM device to a master device, comprising the step of:

synchronizing the at least one slave PWM device to a sync signal from the master device in accordance with claim 12, and when synchronized, coordinating an action between the at least one slave device and the master device.

17. A method according to claim 16, wherein the step of coordinating comprises the coordinated altering of at least primary PWM signals of the slave device and the master device.

18. A method according to claim 16, wherein the coordinated action achieves one of the following:
   a) turn on ramp of a voltage controlled by the slave device, the master device, or both the slave and master device;
   b) turn off ramp of a voltage controlled by the slave device, the master device, or both the slave and master devices; and
   c) a predetermined sequence of turning on/off output voltages controlled by the slave device, the master device or both the slave and master devices.

19. A PWM controller for generating at least one PWM control signal, comprising:
   a clock circuit for generating a clock signal, wherein the controller is configured to derive at least one PWM control signal from a clock input; and
   a sync module having a sync input for receiving a sync signal to which said at least one PWM control signal is to be synchronized, the sync module also comprising
   a frequency comparator for detecting a condition when a frequency of the sync signal is within a predetermined range of the at least one PWM control signal, wherein the frequency comparator comprises a first counter for counting pulses in the at least one PWM control signal and a second counter counting pulses arriving at the sync input, the sync module responsive to adjust the clock circuit to cause a frequency of at least one PWM control signal to match the frequency of the sync signal, the sync module being adapted upon matching the frequency of at least one PWM control signal to the frequency of the sync signal to align a phase of the PWM control signal relative to the sync signal,
   wherein the sync module is adapted to include a phase offset between the sync signal and a primary PWM output when aligning a phase of the primary PWM output with respect to a phase of the sync signal.

20. A PWM controller according to claim 19, wherein the controller is programmable as either a master or a slave device, and wherein as a master device the controller is further adapted to generate the sync signal from the primary PWM control signal for transmission as the sync input to at least one additional controller programmable as a slave device.

21. A PWM controller according to claim 19, wherein, the frequency comparator is adapted for performing a comparison of the first and second counter pulses upon the first counter reaching a predetermined count.

22. A PWM controller according to claim 21, wherein the frequency comparator is adapted for resetting the counters after the first counter reaches the predetermined count.

23. A PWM controller according to claim 19, wherein the range is defined as a ± range on the first counter value.

24. A PWM controller according to claim 21, wherein the predetermined count is programmable, the range is programmable, or both are programmable.

25. A PWM controller according to claim 21, wherein the predetermined count is 12 and the error range is ±2.

26. A PWM controller according to claim 19, wherein the sync module comprises a phase locked loop or a delay locked loop and an adjustable oscillator providing a reference clock signal to which the phase locked loop or delay locked loop locks, a frequency of the adjustable oscillator being responsive to an oscillator trim value.

27. A PWM controller according to claim 26, wherein the trim value is adjusted upwards or downwards in response to the PWM control signal being at a higher or lower frequency than the sync signal or the reference clock signal.

28. A PWM controller according to claim 26, wherein the trim value is held within a counter which is incremented or decremented in response to the PWM control signal being at a higher or lower frequency than the sync signal.

29. A PWM controller according to any one of claim 26, wherein a rate of adjustment of the trim value is limited to maintain stability of the clock circuit.

30. A PWM controller according to claim 26, wherein the predetermined range corresponds to a maximum adjustment available in the adjustable oscillator.

31. A PWM controller according to claim 19, wherein the sync module is adapted to align a phase of the primary PWM output during an inactive period in a switching cycle of the PWM output to ensure no PWM pulse is lost, cut short or extended during synchronization.

32. A PWM controller according to claim 19, wherein the phase offset is programmable.

33. A PWM controller according to claim 19, further comprising one or more status registers containing values indicating a status of a synchronisation process in the PWM controller and optionally also suitable for reporting one or more error states.

34. A PWM controller according to claim 33, wherein the status registers are accessible for reading by a host computer or on-chip microprocessor, optionally allowing for further system debug/monitoring.

35. A PWM controller according to claim 19, wherein the sync module is adapted for continuously monitoring the sync signal for any shift in PWM frequency or missing sync pulses.

36. A PWM controller according to claim 20, wherein the sync signal provided by the master device comprises a pulse having a duration which is predetermined or which is programmable.

37. A PWM controller for generating at least one PWM control signal, comprising:
   a clock circuit for generating a clock signal, wherein the controller is configured to derive at least one PWM control signal from a clock input; and
   a sync module having a sync input for receiving a sync signal to which said at least one PWM control signal is to be synchronized, the sync module also comprising
   a frequency comparator for detecting a condition when a frequency of the sync signal is within a predetermined range of the at least one PWM control signal,
   wherein the frequency comparator comprises a first counter for counting pulses in the at least one PWM control signal and a second counter counting for pulses arriving at the sync input, the sync module responsive to adjust the clock circuit to cause a frequency of at least one PWM control signal to match the frequency of the sync signal, the sync module being adapted upon matching the frequency of at least one PWM control signal to the frequency of the sync signal to align a phase of the PWM control signal relative to the sync signal,
   wherein the-controller is programmable as either a master device or a slave device, and wherein as a master device the controller is further adapted to generate the sync signal from the primary PWM control signal for transmission as the sync input to at least one additional controller programmable as a slave device.

38. A method of synchronizing a PWM device to a synchronization (sync) signal, the PWM device generating a primary PWM output signal from a clock circuit, the method comprising:
- determining when a frequency of the primary PWM output signal of the PWM device is within a predetermined error margin of a frequency of the sync signal;
- upon making such a determination, adjusting a clock circuit of the PWM device to force the frequency of the primary PWM output of the PWM device to match the frequency of the sync signal, and
- upon reaching this condition, aligning a phase of the primary PWM output of the PWM device with respect to a phase of the sync signal such that there is a phase offset between the sync signal and the primary PWM output,
- wherein a rate of adjustment of the frequency from the clock circuit is limited to maintain stability of the clock circuit.

39. A PWM controller for generating at least one PWM control signal, comprising:
- a clock circuit for generating a clock signal, wherein the controller is configured to derive at least one PWM control signal from a clock input; and
- a sync module having a sync input for receiving a sync signal to which said at least one PWM control signal is to be synchronized, the sync module also comprising
- a frequency comparator for detecting a condition when a frequency of the sync signal is within a predetermined range of the at least one PWM control signal, wherein the frequency comparator comprises a first counter for counting pulses in the at least one PWM control signal and a second counter counting pulses arriving at the sync input, the sync module responsive to adjust the clock circuit to cause a frequency of at least one PWM control signal to match the frequency of the sync signal, the sync module being adapted upon matching the frequency of at least one PWM control signal to the frequency of the sync signal to align a phase of the PWM control signal relative to the sync signal,
- wherein the sync module comprises a phase locked loop or a delay locked loop and an adjustable oscillator providing a reference clock signal to which the phase locked loop or delay locked loop locks, a frequency of the adjustable oscillator being responsive to an oscillator trim value.

40. A PWM controller for generating at least one PWM control signal, comprising:
- a clock circuit for generating a clock signal, wherein the controller is configured to derive at least one PWM control signal from a clock input; and
- a sync module having a sync input for receiving a sync signal to which said at least one PWM control signal is to be synchronized, the sync module also comprising
- a frequency comparator for detecting a condition when a frequency of the sync signal is within a predetermined range of the at least one PWM control signal, wherein the frequency comparator comprises a first counter for counting pulses in the at least one PWM control signal and a second counter counting pulses arriving at the sync input, the sync module responsive to adjust the clock circuit to cause a frequency of at least one PWM control signal to match the frequency of the sync signal, the sync module being adapted upon matching the frequency of at least one PWM control signal to the frequency of the sync signal to align a phase of the PWM control signal relative to the sync signal,
- wherein the sync module is adapted to align a phase of a primary PWM output during an inactive period in a switching cycle of the primary PWM output to ensure no PWM pulse is lost, cut short or extended during synchronization.

\* \* \* \* \*

UNITED STATES PATENT AND TRADEMARK OFFICE
CERTIFICATE OF CORRECTION

Page 1 of 1

PATENT NO. : 9,093,986 B2
APPLICATION NO. : 13/080173
DATED : July 28, 2015
INVENTOR(S) : Eamon O'Malley et al.

It is certified that error appears in the above-identified patent and that said Letters Patent is hereby corrected as shown below:

IN THE SPECIFICATION

In column 1, line 25, delete "the of" and insert -- of --, therefor.

In column 8, line 21, delete "running)" and insert -- running). --, therefor.

In column 9, line 64, delete "module" and insert -- module. --, therefor.

IN THE CLAIMS

In column 12, line 25, in claim 4, delete "1," and insert -- 3, --, therefor.

In column 12, line 28, in claim 5, delete "according" and insert -- according to --, therefor.

In column 14, line 13, in claim 29, delete "to any one of" and insert -- to --, therefor.

In column 14, line 64, in claim 37, delete "the-controller" and insert -- the controller --, therefor.

Signed and Sealed this
Second Day of February, 2016

Michelle K. Lee
*Director of the United States Patent and Trademark Office*